(12) United States Patent
Bone et al.

(10) Patent No.: US 6,460,002 B1
(45) Date of Patent: Oct. 1, 2002

(54) METHOD AND APPARATUS FOR DATA STACKIFICATION FOR RUN-TO-RUN CONTROL

(75) Inventors: Christopher A. Bone; Anthony J. Toprac, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/501,494

(22) Filed: Feb. 9, 2000

(51) Int. Cl.⁷ .............................. G06F 19/00
(52) U.S. Cl. ............................ 702/81; 438/14; 702/82; 702/84
(58) Field of Search .................. 702/81, 82, 83, 702/84, 181, 182, 183; 438/7–9, 14, 15, 16, 689, 710, 745

(56) References Cited

U.S. PATENT DOCUMENTS 6,154,711 A * 11/2000 Steffan et al. .............. 702/82
6,248,602 B1 * 6/2001 Bode et al. .................. 438/14
6,256,593 B1 * 6/2001 Damon et al. ............... 702/84

* cited by examiner

Primary Examiner—John S. Hilten
Assistant Examiner—John Le
(74) Attorney, Agent, or Firm—Williams, Morgan & Amerson

(57) ABSTRACT

In one embodiment, a method and apparatus is provided for data stackification for run-to-run control. A process run of semiconductor devices is processed. A manufacturing tag associated with the process run of semiconductor devices is recorded. Metrology data relating to the processed semiconductor devices is then acquired. The present invention calls for performing a metrology data stackification process upon the metrology data using the manufacturing tag for organizing and stacking the metrology data. The present invention provides for modifying at least one control parameter based upon the stacked metrology data.

31 Claims, 5 Drawing Sheets

METHOD AND APPARATUS FOR DATA STACKIFICATION FOR RUN-TO-RUN CONTROL

BACKGROUND OF THE INVENTION

1. Field of the Invention

This invention relates generally to semiconductor products manufacturing, and, more particularly, to a method and apparatus for performing data stacking in an orderly manner for efficient run-to-run control in manufacturing of semiconductor devices.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical (CMT) control, etching, and overlay control. Overlay is one of several important steps in the photolithography area of semiconductor manufacturing. Overlay process involves measuring the misalignment between two successive patterned layers on the surface of a semiconductor device. Generally, minimization of misalignment errors is important to ensure that the multiple layers of the semiconductor devices are connected and functional. Generally, after the photolithography process is performed on a semiconductor device, an etch process is performed on the semiconductor device for forming a plurality of subsections within a semiconductor device, such as a gate. As technology facilitates smaller critical dimensions for semiconductor devices, the need for reduced of errors increases dramatically.

Generally, process engineers currently analyze the process errors a few times a month. The results from the analysis of the process errors are used to make updates to process tool settings manually. Generally, a manufacturing model is employed to control the manufacturing processes. Some of the problems associated with the current methods include the fact that the process tool settings are only updated a few times a month. Furthermore, currently the process tool updates are generally performed manually. Many times, errors in semiconductor manufacturing are not organized and reported to quality control personal. Often, the manufacturing models themselves incur bias errors that could compromise manufacturing quality.

Generally, a set of processing steps is performed on a lot of wafers on a semiconductor manufacturing tool called an exposure tool or a stepper, followed by processing of the semiconductor wafers in etch tools. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. Furthermore, manufacturing data that is often acquired in different sequences resulting in data sets that are out of order. Manufacturing data sets that are out of order causes additional difficulties in sorting through manufacturing errors and correcting them.

The present invention is directed to overcoming, or at least reducing the effects of, one or more of the problems set forth above.

SUMMARY OF THE INVENTION

In one aspect of the present invention, a method is provided for organizing production data. At least one process run of semiconductor devices is performed. At least one manufacturing tag associated with the process run of semiconductor devices is recorded. Metrology upon at least one of the process run of semiconductor device is performed for acquiring metrology data. A metrology data stackification process is performed upon the metrology data using the manufacturing tag for organizing and stacking the metrology data. At least one control parameter is modified based upon the stacked metrology data.

In another aspect of the present invention, an apparatus is provided for organizing production data. The apparatus of the present invention comprises: a processing tool for processing a production run of semiconductor wafers; a metrology tool coupled with the processing tool and being capable of acquiring metrology data relating to the processed semiconductor wafers; a metrology data stacking unit coupled with the metrology tool and being capable of stacking the metrology data; a computer system coupled with the metrology data stacking unit and being capable of controlling directing and storing metrology data bi-directionally to and from the metrology data stacking unit; a control parameter filter unit coupled with the computer system and being capable of filtering data from the metrology data stacking unit; and a manufacturing model coupled with the computer system and the processing tool, the manufacturing model being capable of modifying control parameters in response to the filtering data from the metrology data stacking unit, for controlling the processing tool.

BRIEF DESCRIPTION OF THE DRAWINGS

The invention may be understood by reference to the following description taken in conjunction with the accompanying drawings, in which like reference numerals identify like elements, and in which.

Figure 1:
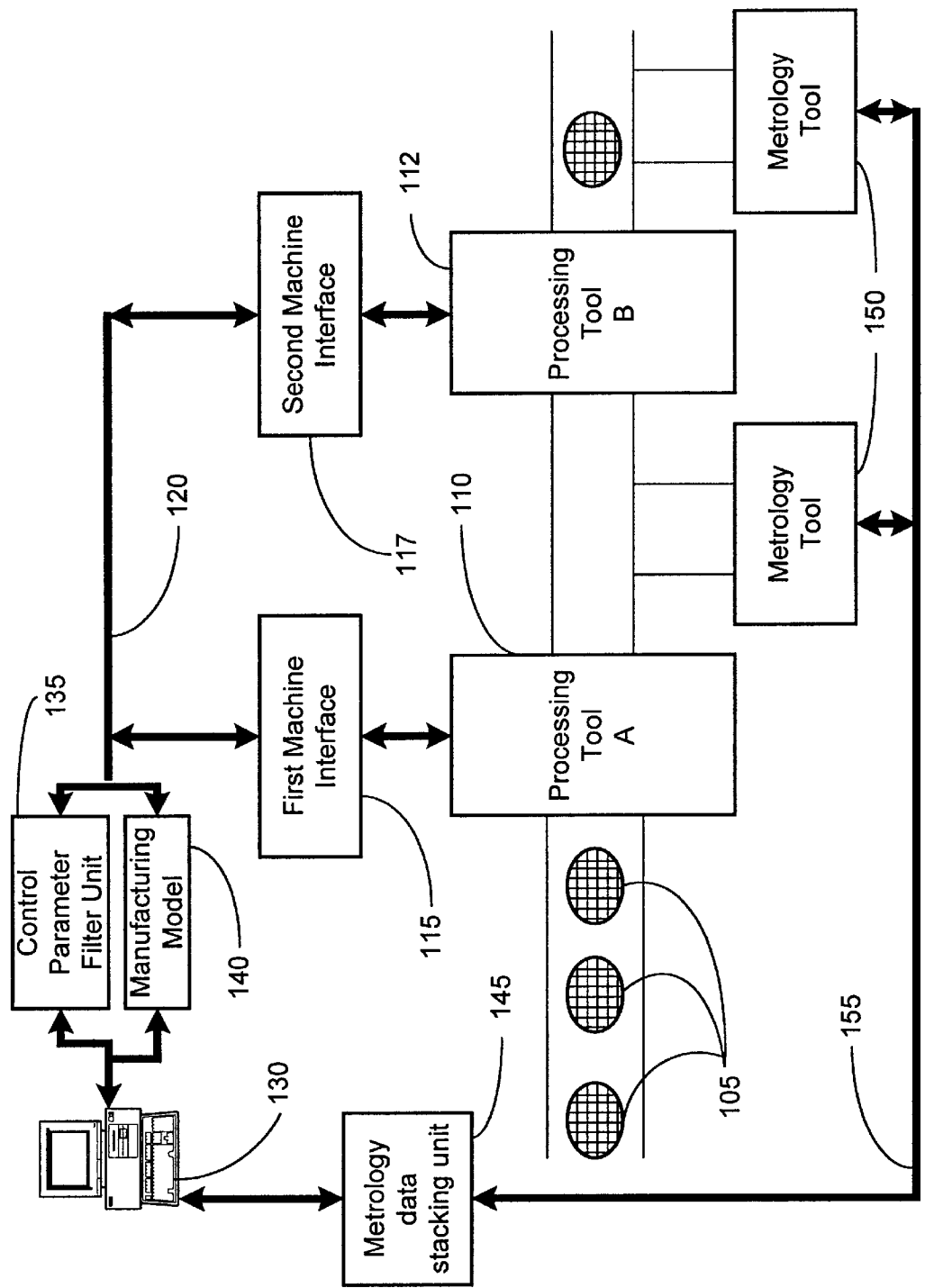
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. Overlay and etching processes are important groups of process steps in semiconductor manufacturing. In particular, metrology data, including manufacturing data, is acquired after manufacturing processes such as photolithography and photoresist etching processes are substantially completed. The metrology data can be used to make adjustments to manufacturing processes for subsequent manufacturing runs of semiconductor devices, such as semiconductor wafers. Proper organization and retrieval of metrology data is important in making adjustments to subsequent manufacturing processes. Many times, a plurality of manufacturing lots of semiconductor wafers is processed and metrology data relating to each of the manufacturing lots are acquired out of order. Often, measurement processes of some manufacturing lots are omitted and other times, only part of a production line is examined. This could result in incomplete or out of sequence metrology data, which could cause inefficiencies in filtering the metrology data and performing corrections based upon the filtered data. The present invention provides a method and apparatus for organizing metrology data and efficiently filtering the metrology data and performing adjustment on a run-to-run control basis.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. A control parameter filter unit 135, which in one embodiment is a computer software program, is utilized by the computer system 130 to control the manufacturing processes performed by the processing tools 110, 112. In one embodiment, the control parameter filter unit 135 is integrated into the computer system 130. In one embodiment, the control parameter filter unit 135 is capable of performing EWMA filtering upon the metrology data and generating and modifying at least one control input signal, on the line 120, that controls the semiconductor manufacturing operations performed by the processing tools A and B 110, 112.

In one embodiment, the control parameter filtering unit 135 filters and processes data that is organized by the metrology data-stacking unit 145. In one embodiment, the metrology data-stacking unit 145 comprises a computer software program and a data storage device. The metrology data-stacking unit 145 acquires metrology data from a metrology tool 150 on a line 155 and organizes and stacks the acquired metrology data. The computer system 130 then accesses the metrology data and sends the metrology data to the control parameter filtering unit 135. In one embodiment, the metrology data-stacking unit 145 is integrated into the computer system 130.

In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers and etch process tools. In one embodiment, processing tool A 110 is a standard etch process tool and processing tool B 112 is a secondary etch process tool.

For processing tools such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. For processing tools such as etch process tools, the control inputs on the line 120 include an etch time-period control signal, an etch temperature control signal, and an etch pressure control signal.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

Figure 2:
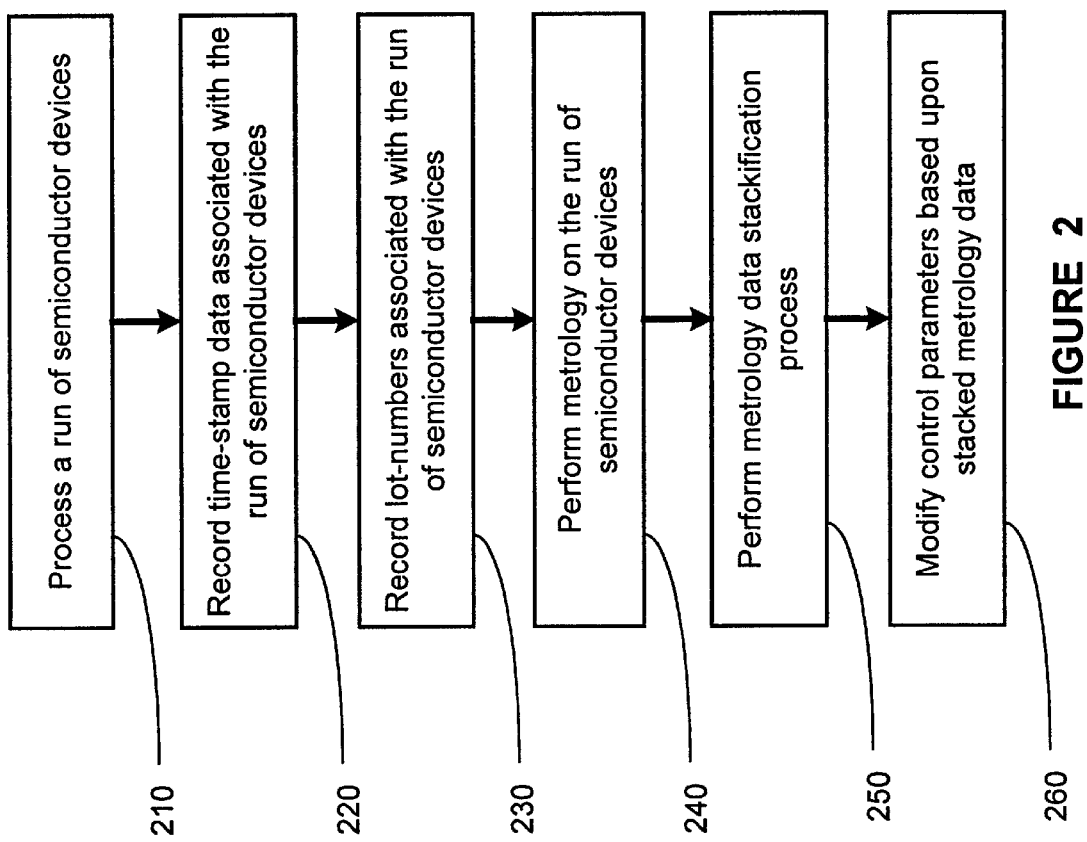
FIG. 2 illustrates a flowchart representation of one method of organizing manufacturing data and correcting manufacturing errors, as taught by the present invention.

Turning now to FIG. 2, a flow chart representation of one method of performing stacking and filtering of production data is illustrated. At least one production run of semiconductor devices, such as semiconductor wafers, is processed, as described in block 210 of FIG. 2. In one embodiment, a photolithography process is performed on the semiconductor wafers. However, it is understood that other semiconductor manufacturing processes that are known by those skilled in the art can be implemented by methods and apparatus taught by the present invention.

After at least one production run of semiconductor wafers is processed, a corresponding time stamp associated with the time and date of the production run is recorded for later retrieval, as described in block 220 of FIG. 2. In one embodiment, the time stamp is stored in the memory (not shown) of the computer system 130. In one embodiment, the computer system 130 is integrated with a process control system, such as the APC framework. Furthermore, a lot number associated with the production run of semiconductor wafers is also recorded for later retrieval, as described in block 230 of FIG. 2. In one embodiment, the lot number is stored in the memory of the computer system 130.

Once the time stamp and lot number associated with a production run of processed semiconductor wafers are recorded, metrology is performed on the production run of processed semiconductor wafers, as described in block 240 of FIG. 2. In one embodiment, metrology is performed on the processed semiconductor wafers using the metrology tool 150. Metrology data from the metrology tool 150 is extracted by the computer system 130 and sent to the metrology data-stacking unit 145 via the line 155. Once metrology data is acquired, metrology data stackification process is performed, as described in block 250 of FIG. 2. A more detailed depiction of the steps for performing metrology data stackification process is illustrated in FIG. 3.

Figure 3:
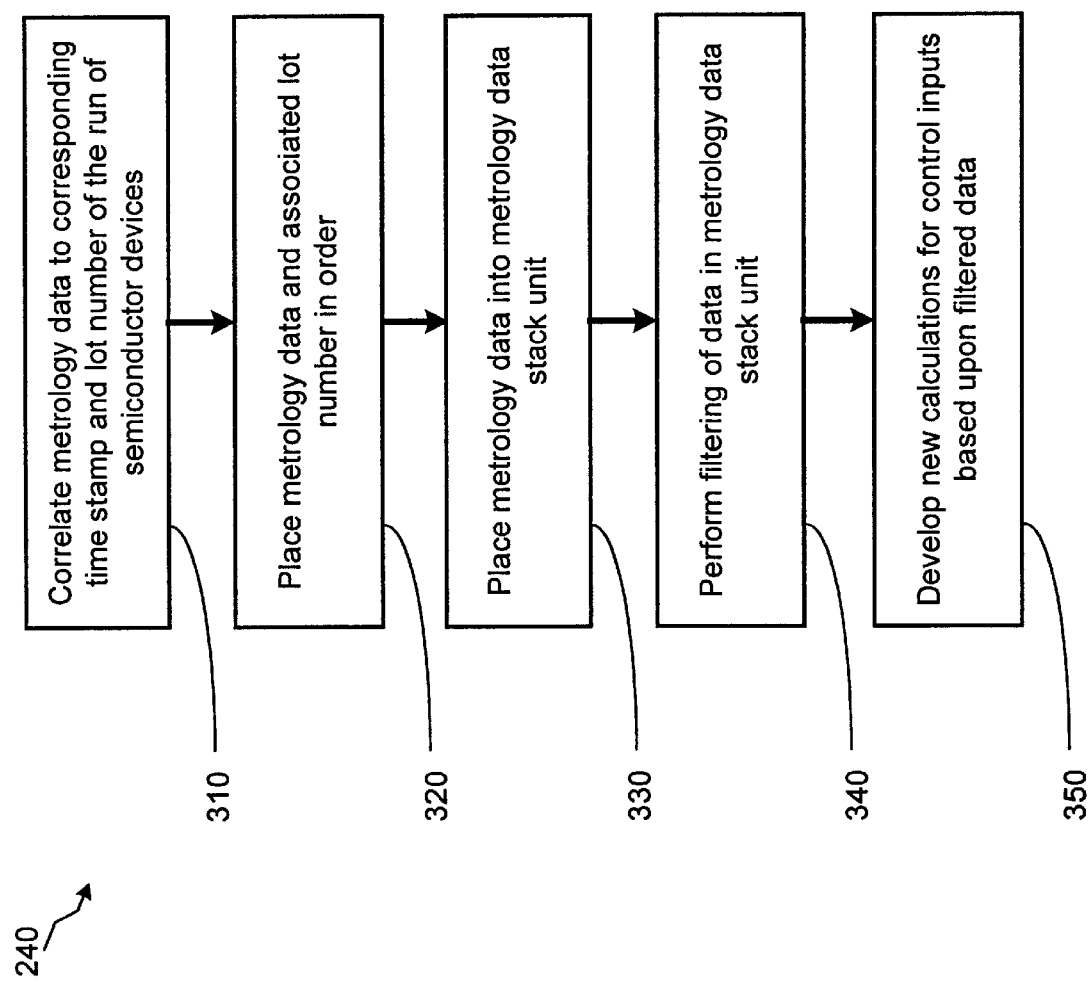
FIG. 3 illustrates a more detailed depiction of the step of performing manufacturing data stackification described in FIG. 2.

Turning now to FIG. 3, the recorded time stamp data and the lot number data that are associated with a particular production run of semiconductor wafers from which the metrology data was acquired, are extracted from storage and correlated with the metrology data, as described in block 310 of FIG. 3. Once the time stamp and the lot number are correlated with a particular set of metrology data, an order for organizing the metrology data and its corresponding time stamp and lot number data, is determined, as described in block 320 of FIG. 3. In one embodiment, the metrology data stacking unit 145 generates the order for organizing the metrology data. In one embodiment, the metrology data is organized in chronological order with respect to the time stamp associated with a particular run of semiconductor wafers from which the metrology data was acquired. In an alternative embodiment, the metrology data is organized in a numerical order with respect to the lot number associated with a particular run of semiconductor wafers from which the metrology data was acquired. Other manufacturing tagging data known by those skilled in the art can be employed to generate an order for organizing the metrology data.

Figure 4:
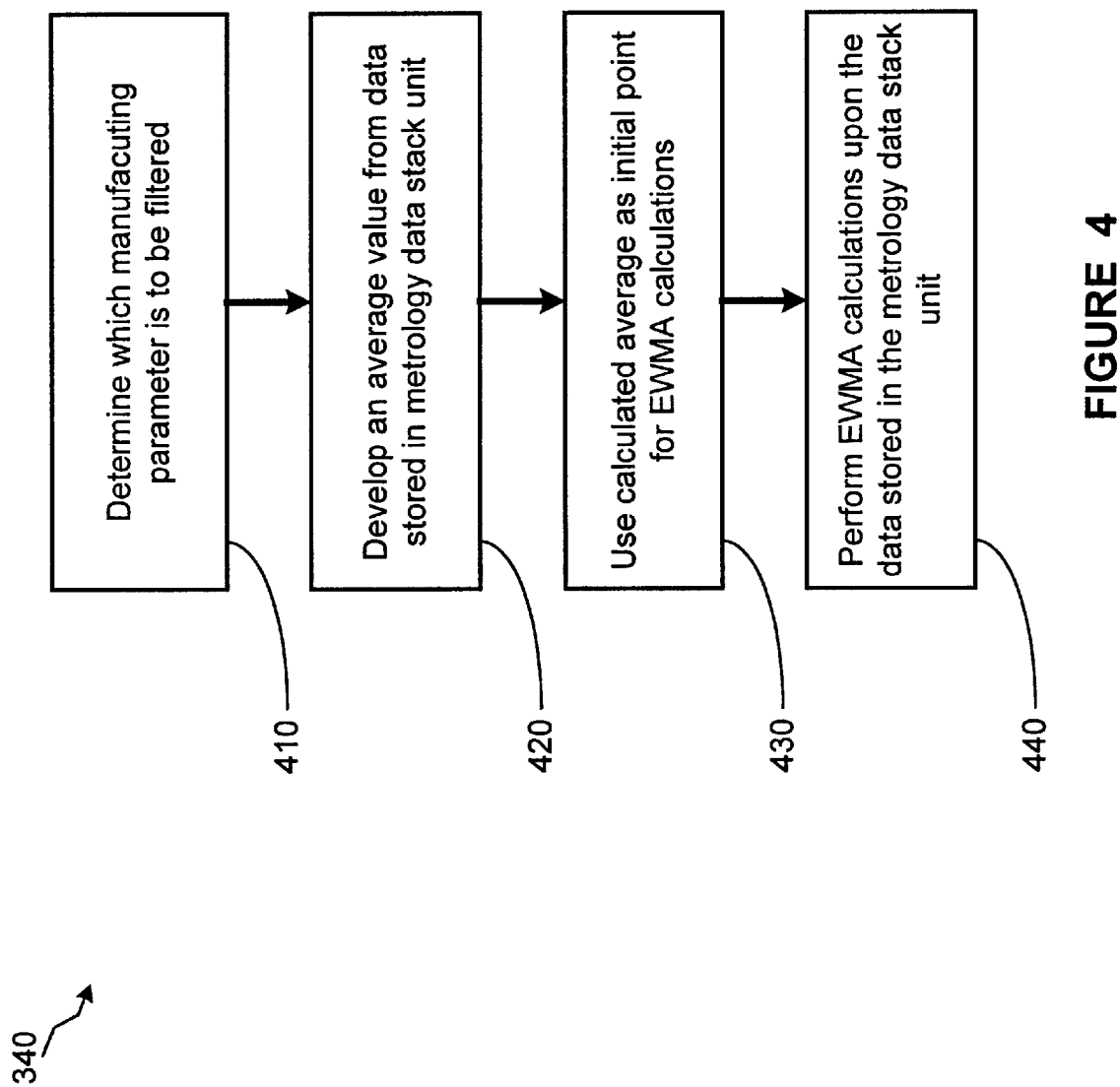
FIG. 4 illustrates a flowchart representation of a more detailed depiction of the method of filtering manufacturing data described in FIG. 3.

When the order for the organization of metrology data is determined, the metrology data is stacked in that order, as described in block 330 of FIG. 3. In one embodiment, the metrology data is stacked in memory within the metrology data stacking unit 145. The metrology is then ready to be retrieved and used for analysis to correct errors in subsequent production run of semiconductor wafers. In order to properly process the stacked metrology data, the metrology data is generally filtered to reduce noise and other data errors within the stacked metrology data. Therefore, a data filtering process is employed on the data stored in the metrology data stack unit 145. A more detailed depiction of the steps for performing filtering of data stored in the metrology data stacking unit 145 is illustrated in FIG. 4. In one embodiment, an Exponentially-Weighted Moving Average (EWMA) filtering process is employed to filter the stacked data in the metrology data stacking unit 145.

Turning now to FIG. 4, a determination is made regarding which particular manufacturing parameter within the stacked data in the metrology data stacking unit 145 is to be filtered, as described in block 410. An average value is calculated for the particular manufacturing parameter to be filtered, as described in block 420 of FIG. 4. Once an average value of a particular manufacturing parameter is determined, the average value is used as an initial point for the EWMA calculations, as described in block 430 of FIG. 4. When the initial point for the EWMA calculation is determined, the EWMA filtering process is performed on the manufacturing parameter stored in the metrology data stacking unit 145, as described in block 440 of FIG. 4. One embodiment of employing the EWMA filtering process is described below.

The EWMA filtering process is used to smooth out the data stored in the metrology data stacking unit. This is important because the error measurements are subject to a certain amount of randomness, such that the error significantly deviates in value. Filtering the stacked data results in a more accurate assessment of the error in the control input signal settings used to control the semiconductor manufacturing processes performed by the processing tool A and B 110, 112. In one embodiment, the overlay control scheme generally utilizes the EWMA filter, although other filtering procedures can be utilized in this context. The equation for the EWMA filter is illustrated in Equation 1.

$$\text{New average} = (\text{weight}) * (\text{current measurement}) + (1 - \text{weight}) * (\text{previous EWMA average})] \quad \text{Equation 1}$$

Figure 5:
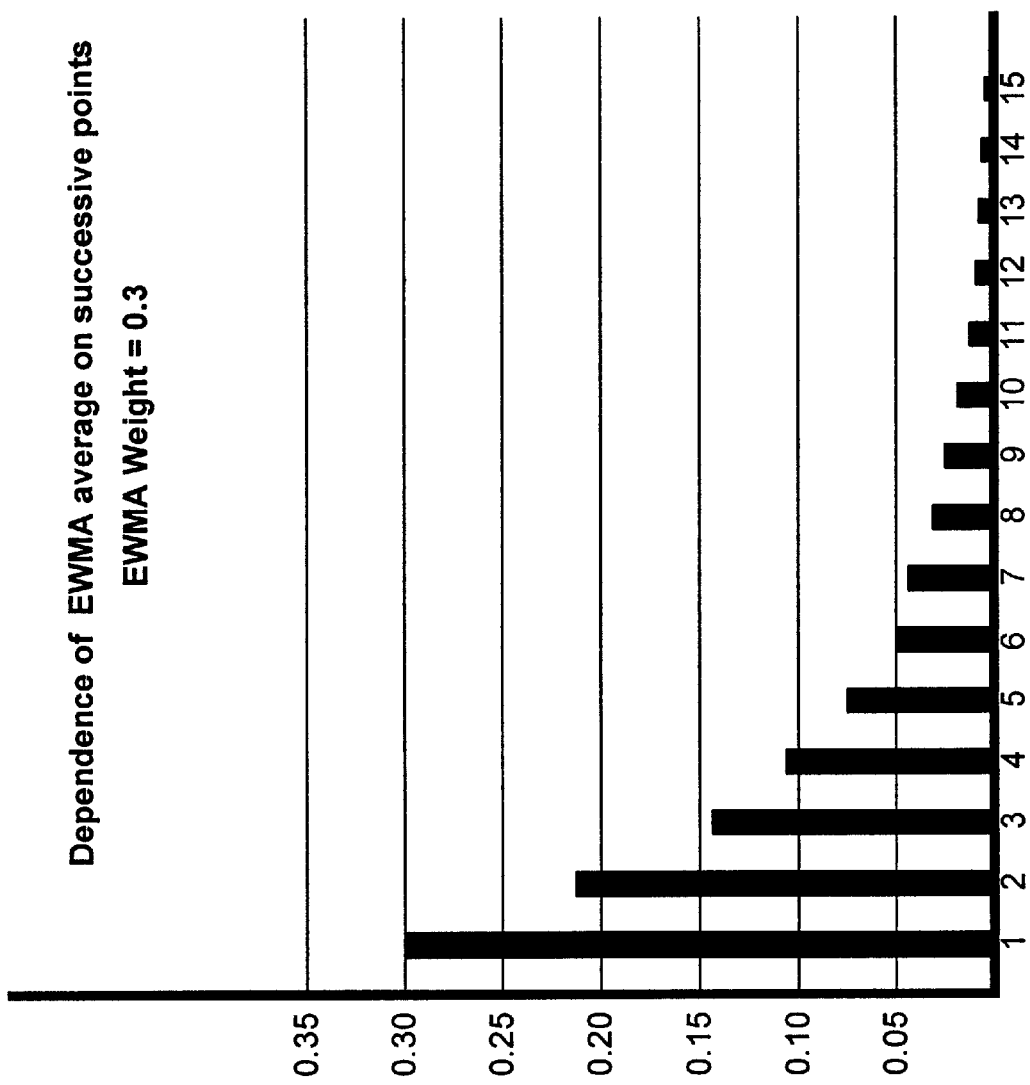
FIG. 5 illustrates the dependence of the average on each successive point in an Exponentially-Weighted Moving Average (EWMA) filter.

The weight is an adjustable parameter that can be used to control the amount of filtering and is generally between zero and one. The weight represents the confidence in the accuracy of the current data point. If the measurement is considered to be accurate, the weight should be close to one. If there were a significant amount of fluctuations in the process, then a number closer to zero would be appropriate. The new average is calculated from the current measurement, the weight, and the last average calculated. The dependence of the average on each successive point is illustrated in FIG. 5.

In one embodiment, there are at least two methods of utilizing the EWMA filtering process. The first implementation is to use the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second option is to retain only some of the data and calculate the average from the raw data each time.

The manufacturing environment in the semiconductor manufacturing fab presents some unique challenges. The order that the semiconductor wafer lots are processed through a semiconductor manufacturing tool, such as a stepper, may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the control input signal settings. Furthermore, it may not be desirable to retain all historical process data since the disk storage space within a control database may be limited. Older process data may be discarded without causing a significant change in the EWMA estimate, as the relative weight on older data diminishes in the EWMA calculations.

For the reasons discussed above, and for other considerations known by those skilled in the art, the overlay controller uses limited storage of data to calculate the EWMA filtered error. Semiconductor wafer lot data, including the lot number, the time the lot was processed on the semiconductor manufacturing tool, such as the stepper, and the multiple error estimates, are stored in a data storage (called Data Store [not shown] in one embodiment) under a control thread name. When a new set of data is collected, the stack of data is retrieved from Data Store and analyzed. The lot number of the current semiconductor wafer lot being processed is compared to those in the stack. If the lot number matches any of the data present there, the error measurements are replaced. Otherwise, the data point is added to the current stack in chronological order, according to the time periods when the lots were processed through the stepper. In one embodiment, any data point within the stack that is over 120 hours old is removed. Once the aforementioned steps are complete, the new filter average is calculated and stored to Data Store.

Referring back to block 350 of FIG. 3, once the EWMA filtering process is completed, new calculations for the control inputs for semiconductor manufacturing processes, based upon the filtered data are determined, which substantially concludes the metrology data stackification process described in block 240 of FIG. 2. The new calculation for the control inputs are performed by one of a number of control input modification sequences that are known by those skilled in the art. Turning back to FIG. 2, once the new calculations for new control input parameters are determined, the control input parameters are modified for use in a subsequent production run of semiconductor wafers, as described in block 260 of FIG. 2. The modified control inputs are implemented into the manufacturing model 140, reducing errors during subsequent production runs of semiconductor wafers. In one embodiment, the control inputs are modified on a run-to-run basis.

The principles taught by the present invention can be implemented in an Advanced Process Control (APC) Framework. The APC is a preferred platform from which to implement the overlay control and etch process control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller and etch process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

performing at least one process run of semiconductor devices;

recording at least one manufacturing tag associated with said process run of semiconductor devices;

performing metrology upon at least one said process run of semiconductor device for acquiring metrology data;

performing a metrology data stackification process upon said metrology data using said manufacturing tag for organizing and stacking said metrology data; and modifying at least one control parameter based upon said stacked metrology data.

2. The method described in claim 1, wherein recording at least one manufacturing tag associated with said process run of semiconductor devices further comprises recording a time stamp associated with said process run of semiconductor devices.

3. The method described in claim 1, wherein recording at least one manufacturing tag associated with said process run of semiconductor devices further comprises recording a lot number associated with said process run of semiconductor devices.

4. The method described in claim 1, wherein performing a process run of semiconductor devices further comprises processing semiconductor wafers.

5. The method described in claim 4, wherein processing semiconductor wafers further comprises performing a photoresist etching process on said semiconductor wafers.

6. The method described in claim 4, wherein processing semiconductor wafers further comprises performing a photolithography process on said semiconductor wafers.

7. The method described in claim 1, wherein performing a metrology data stackification process upon said metrology data further comprises:

correlating said metrology data to at least one of a corresponding lot number and a corresponding time stamp of said production run of semiconductor devices;

determining an order for organizing said metrology data based upon said correlation of said metrology data;

stacking said metrology data based upon said order for organizing said metrology data for creating stacked data;

filtering said stacked data for generating filtered stacked data; and calculating modified values for at least one control input parameter based upon said filtered stacked data.

8. The method described in claim 7, wherein determining an order for organizing said metrology data further comprises determining a chronological order in relation to said time stamp for organizing said metrology data.

9. The method described in claim 8, wherein stacking said metrology data further comprises storing said metrology data in a chronological sequence in relation to said time stamp.

10. The method described in claim 7, wherein determining an order for organizing said metrology data further comprises determining a numerical order in relation to said lot number for organizing said metrology data.

11. The method described in claim 10, wherein stacking said metrology data further comprises storing said metrology data in a numerical sequence in relation to said lot number.

12. The method described in claim 7, wherein filtering said stacked data for generating filtered stacked data further comprises:

determining a manufacturing parameter within the stacked data to be filtered;

calculating an average value of said manufacturing parameter;

using said average value as an initial point for performing filtering; and performing filtering upon said manufacturing parameter using said initial point.

13. The method described in claim 12, wherein performing filtering upon said manufacturing parameter further comprises performing an Exponentially Weighted Moving Average (EWMA) calculation.

14. An apparatus, comprising:

a processing tool for processing a production run of semiconductor wafers;

a metrology tool coupled with said processing tool and being capable of acquiring metrology data relating to said processed semiconductor wafers;

a metrology data stacking unit coupled with said metrology tool and being capable of stacking said metrology data;

a computer system coupled with said metrology data stacking unit and being capable of controlling directing and storing metrology data bi-directionally to and from said metrology data stacking unit;

a control parameter filter unit coupled with said computer system and being capable of filtering data from said metrology data stacking unit; and a manufacturing model coupled with said computer system and said processing tool, said manufacturing model being capable of modifying control parameters in response to said filtering data from said metrology data stacking unit, for controlling said processing tool.

15. The apparatus of claim 14, wherein said processing tool is capable of performing photolithography manufacturing operation upon at least one semiconductor wafer.

16. The apparatus of claim 14, wherein metrology data stacking unit further comprises a data ordering algorithm and a data storage unit.

17. The apparatus of claim 14, wherein control parameter filter unit is capable of performing Exponential Weighted Moving Average filtering processes.

18. A system, comprising:

means for performing at least one process run of semiconductor devices;

means for recording a time stamp associated with said process run of semiconductor devices;

means for recording a lot number associated with said process run of semiconductor devices;

means for performing metrology upon at least one said process run of semiconductor device for acquiring metrology data;

means for performing a metrology data stackification process upon said metrology data using said recorded time stamp and said lot number for organizing and stacking said metrology data; and means for modifying at least one control parameter based upon said stacked metrology data.

19. The computer readable program storage device encoded with instructions that, when executed by a computer, performs the method described in claim 18, wherein recording at least one manufacturing tag associated with said process run of semiconductor devices further comprises recording a time stamp associated with said process run of semiconductor devices.

20. The computer readable program storage device encoded with instructions that, when executed by a computer, performs the method described in claim 18, wherein recording at least one manufacturing tag associated with said process run of semiconductor devices further comprises recording a lot number associated with said process run of semiconductor devices.

21. The computer readable program storage device encoded with instructions that, when executed by a computer, performs the method described in claim 18, wherein performing a process run of semiconductor devices further comprises processing semiconductor wafers.

22. The computer readable program storage device encoded with instructions that, when executed by a computer, performs the method described in claim 21, wherein processing semiconductor wafers further comprises performing a photoresist etching process on said semiconductor wafers.

23. The computer readable program storage device encoded with instructions that, when executed by a computer, performs the method described in claim 21, wherein processing semiconductor wafers further comprises performing a photolithography process on said semiconductor wafers.

24. The computer readable program storage device encoded with instructions that, when executed by a computer, performs the method described in claim 18, wherein performing a metrology data stackification process upon said metrology data further comprises:

correlating said metrology data to at least one of a corresponding lot number and a corresponding time stamp of said production run of semiconductor devices;

determining an order for organizing said metrology data based upon said correlation of said metrology data;

stacking said metrology data based upon said order for organizing said metrology data for creating stacked data;

filtering said stacked data for generating filtered stacked data; and calculating modified values for at least one control input parameter based upon said filtered stacked data.

25. The computer readable program storage device encoded with instructions that, when executed by a computer, performs the method described in claim 24, wherein determining an order for organizing said metrology data further comprises determining a chronological order in relation to said time stamp for organizing said metrology data.

26. The computer readable program storage device encoded with instructions that, when executed by a computer, performs the method described in claim 25, wherein stacking said metrology data further comprises storing said metrology data in a chronological sequence in relation to said time stamp.

27. The computer readable program storage device encoded with instructions that, when executed by a computer, performs the method described in claim 24, wherein determining an order for organizing said metrology data further comprises determining a numerical order in relation to said lot number for organizing said metrology data.

28. The computer readable program storage device encoded with instructions that, when executed by a computer, performs the method described in claim 27, wherein stacking said metrology data further comprises storing said metrology data in a numerical sequence in relation to said lot number.

29. The computer readable program storage device encoded with instructions that, when executed by a computer, performs the method described in claim 24, wherein filtering said stacked data for generating filtered stacked data further comprises:

determining a manufacturing parameter within the stacked data to be filtered;

calculating an average value of said manufacturing parameter;

using said average value as an initial point for performing filtering; and performing filtering upon said manufacturing parameter using said initial point.

30. The computer readable program storage device encoded with instructions that, when executed by a computer, performs the method described in claim 29, wherein performing filtering upon said manufacturing parameter further comprises performing an Exponentially Weighted Moving Average (EWMA) calculation.

31. A computer readable program storage device encoded with instructions that, when executed by a computer, performs a method, comprising:

performing at least one process run of semiconductor devices;

recording at least one manufacturing tag associated with said process run of semiconductor devices;

performing metrology upon at least one said process run of semiconductor device for acquiring metrology data;

performing a metrology data stackification process upon said metrology data using said manufacturing tag for organizing and stacking said metrology data; and modifying at least one control parameter based upon said stacked metrology data.

* * * * *

UNITED STATES PATENT AND TRADEMARK OFFICE
CERTIFICATE OF CORRECTION

PATENT NO.     : 6,460,002 B1
DATED          : October 1, 2002
INVENTOR(S)    : Christopher A. Bode and Anthony J. Toprac Page 1 of 1

It is certified that error appears in the above-identified patent and that said Letters Patent is hereby corrected as shown below:

<u>Title page,</u>
Item [75], please change the first inventor's name to:
-- Christopher A. Bode --

Signed and Sealed this

Twenty-third Day of March, 2004

JON W. DUDAS
*Acting Director of the United States Patent and Trademark Office*